United States Patent
Bracaleone (10) Patent No.: US 7,019,219 B2
(45) Date of Patent: *Mar. 28, 2006

(54) QUADRAX TO TWINAX CONVERSION APPARATUS AND METHOD

(76) Inventor: Salvatore Bracaleone, 23726 Via Roble, Trabuco Canyon, CA (US) 92679

( * ) Notice: Subject to any disclaimer, the term of this patent is extended or adjusted under 35 U.S.C. 154(b) by 0 days.

This patent is subject to a terminal disclaimer.

(21) Appl. No.: 10/899,515

(22) Filed: Jul. 26, 2004

(65) Prior Publication Data

US 2004/0262028 A1      Dec. 30, 2004

Related U.S. Application Data

(63) Continuation of application No. 10/096,087, filed on Mar. 11, 2002, now Pat. No. 6,794,578.

(60) Provisional application No. 60/276,263, filed on Mar. 14, 2001.

(51) Int. Cl.
*H01B 7/08*      (2006.01)

(52) U.S. Cl. ................................. 174/117 FF
(58) Field of Classification Search .......... 174/117 FF, 174/251, 117 F; 333/1, 236, 243; 439/460
See application file for complete search history.

(56) References Cited

U.S. PATENT DOCUMENTS

| | | | |
|---|---|---|---|
| 4,891,616 A * | 1/1990 | Renken et al. ............. 333/236 |
| 5,003,273 A * | 3/1991 | Oppenberg .................... 333/1 |
| 5,242,318 A | 9/1993 | Plass | |
| 5,811,727 A * | 9/1998 | Lo ............................. 174/36 |
| 6,290,532 B1 * | 9/2001 | Vermeersch et al. ........ 439/460 |
| 6,506,971 B1 * | 1/2003 | Grach et al. ................. 174/32 |

* cited by examiner

*Primary Examiner*—Chau N. Nguyen
(74) *Attorney, Agent, or Firm*—Knobbe, Martens, Olson & Bear, LLP (57) ABSTRACT

A Quadrax to Twinax conversion apparatus includes stacked trace layers of transmission line with a ground plane between the trace layers. Embodiments include trace layers of stripline or microstrip. Orthogonal plated through holes include a diagonal pair of through holes in electrical contact with traces on one of the trace layers and another diagonal pair of through holes in electrical contact with another trace layer. Contact pins extend through these orthogonal plated through holes with one pair of pins making electrical contact with one trace layer and the other pair of pins making electrical contact with another trace layer. The conversion apparatus electrically connects Twinax cables to respectively different trace layers without crossing over or disturbing the relative positions of the Quadrax diagonal pairs for very efficient high-speed data transfer from four wire Quadrax to two wire Twinax cables.

9 Claims, 12 Drawing Sheets

FIG. 3A STRIPLINE

FIG. 3B MICROSTRIP

QUADRAX TO TWINAX CONVERSION APPARATUS AND METHOD

This application is a continuation of U.S. application Ser. No. 10/096,087, filed Mar. 11, 2002 entitled "QUADRAX TO TWINAX CONVERSION APPARATUS AND METHOD" and claims the benefit of U.S. Provisional Application No. 60/276,263 filed Mar. 14, 2001 entitled "QUADRAX TO TWINAX CONVERSION APPARATUS AND METHOD", the entire contents of which is expressly incorporated by reference.

FIELD OF THE INVENTION

This invention relates to high-speed data transference and particularly to conversion from four wire (Quadrax) to two wire (Twinax).

SUMMARY OF THE INVENTION

High speed data transference requires transmission systems that minimize reflections. This is achieved through controlled characteristic impedance from source to load. In conventional microwave systems, this is accomplished with waveguide or coaxial transmission lines. However, with current high-speed data transfer, such as fiber channel, the source and load differential impedances are usually high and of the order of 100 to 150 ohms. Achieving these high impedances in coaxial transmission lines is size prohibitive. A more efficient transmission line for high-speed data transfer is Twinax wherein the signals are carried between a pair of conductors.

An even more efficient transmission line is four-channel Quadrax, wherein four wires are carried within a single enclosure. However, as described below, significant problems arise when the four channels must be physically separated.

The preferred embodiment of the present invention provides a solution to this problem and utilizes a novel combination of stacked stripline or microstrip and contact pins extending into the through-hole plated openings to locate a common ground plane between two trace layers to couple to two wire (Twinax) conductor without disturbing the relative positions of the diagonal pairs of the four wire (Quadrax) conductor.

DETAILED DESCRIPTION OF THE PREFERRED EMBODIMENT

Currently, high-speed data transference requires transmission systems that minimize reflections. This is achieved through controlled characteristic impedance from source to load. In microwave systems, this is accomplished with waveguide or coaxial transmission lines. In both cases, the line geometry is the determining factor along with dielectric and conductor materials. Steps, bends, protrusions etc. will invariably cause reflections with consequent loss of transmission efficiency (insertion loss) and sending-end disturbance. In 2-wire differential-mode transmissions this is acceptable at lower data rates. When data rates become higher, such as fiber channel (into microwave frequencies), the line characteristic impedances become much more critical.

Figure 1A:
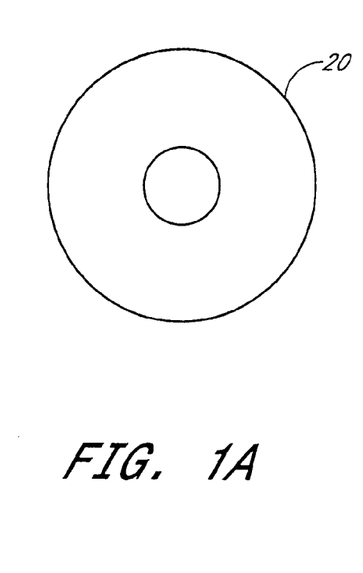
FIG. 1(A) illustrates a single conductor coaxial transmission line in cross-section.
Figure 1B:
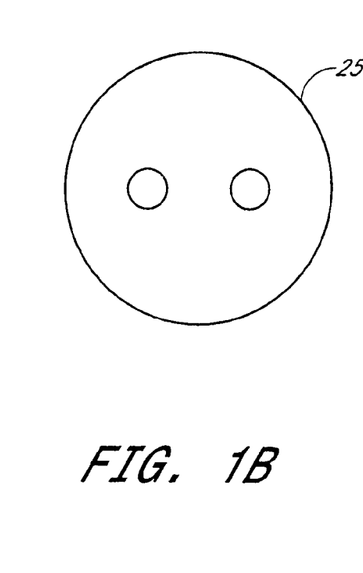
FIG. 1(B) illustrates a two conductor (Twinax) transmission line in cross-section.

In fiber channel systems the source and load differential impedances are usually high (100–150Ω). Achieving these high impedances in a coaxial transmission line 20 (FIG. 1(A)) is size prohibitive. As a result, a line configuration such as Twinax 25 (FIG. 1(B)) wherein the signals are carried between a pair of conductors (usually round) critically spaced from each other and surrounded by a conductive enclosure. In this "differential line," high impedances are easily obtained since the mutual capacitance between the conductors is minimized.

Figure 1C:
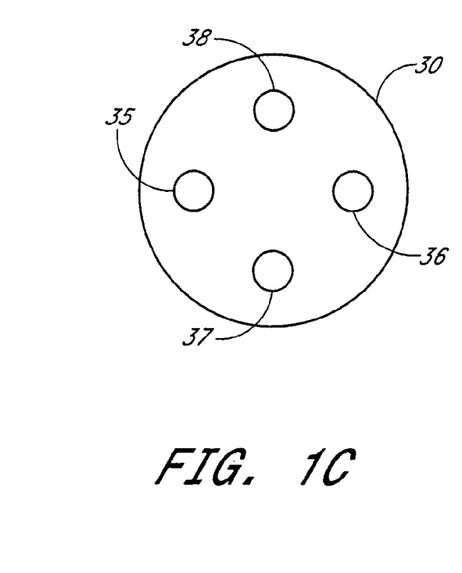
FIG. 1(C) illustrates a four conductor (Quadrax) transmission line in cross-section.

A more efficient development for fiber channel transmission is called Quadrax 30 (FIG. 1(C)), having a single enclosure enclosing four wires 35, 36, 37, and 38. In Quadrax, a pair of conductors forms a Twinax differential pair. These respective pairs 35, 36 and 37, 38 must be diagonal because the paired conductor electric fields are mutually perpendicular and will therefore not couple. This condition eliminates cross talk, maintaining channel isolation.

Quadrax rather than Twinax is advantageously employed for longer line runs. However, a significant problem arises in the prior art when the two orthogonal channels of the Quadrax are physically separated into two separate pairs of Twinax. In the prior art, the pairs of the Quadrax 30 cross over when converted to Twinax resulting in impedance disturbance and reflections with some cross talk. At low frequencies or data rates, this is somewhat manageable, however, when data rates approach microwave frequencies, the resulting system degradation becomes unacceptable.

Figure 2:
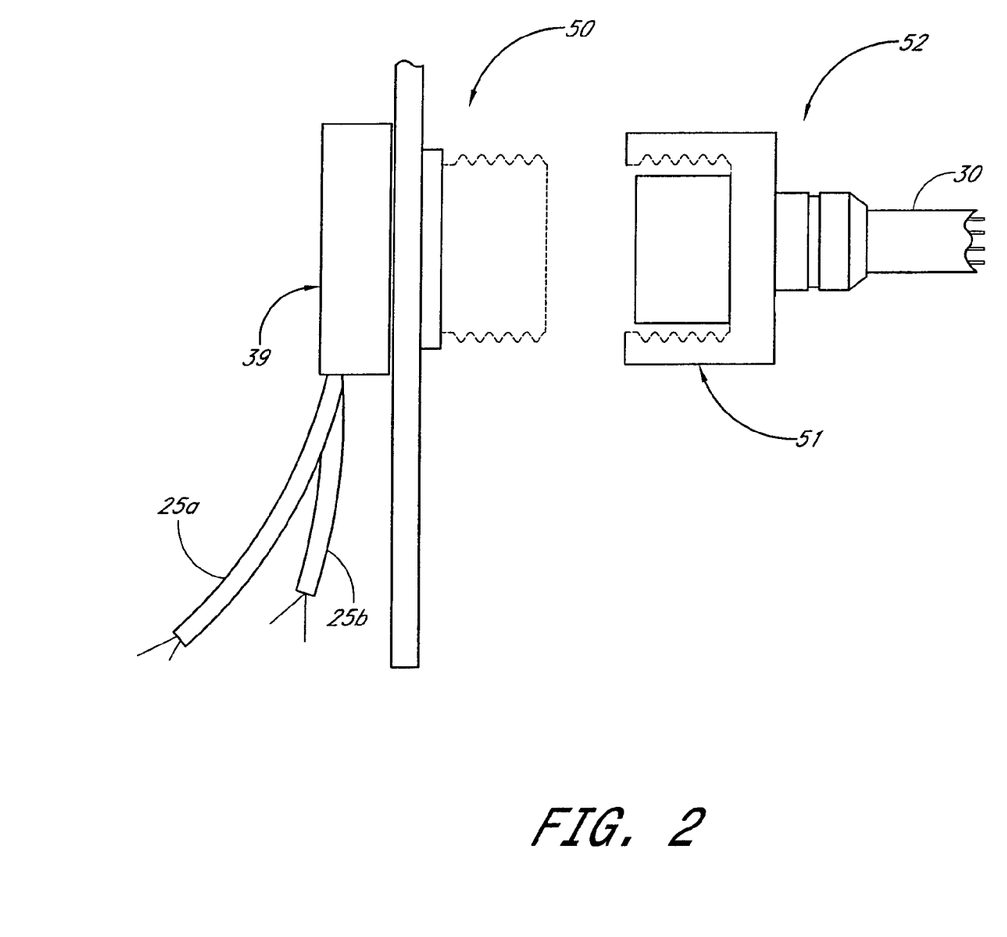
FIG. 2 illustrates, in partial cross-section, the external configuration of one embodiment of the invention.
Figure 3A:
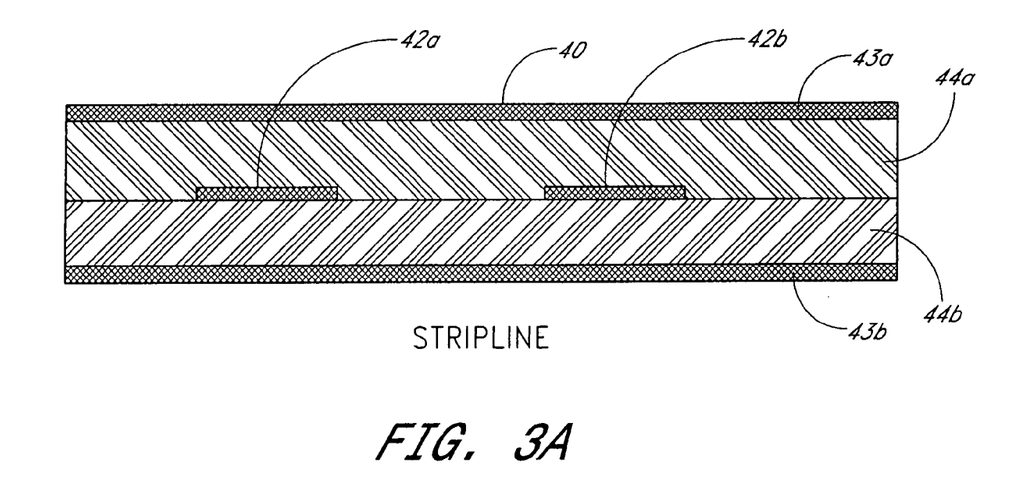
FIGS. 3(A) and 3(B) respectively illustrate, in cross-section and in substantial enlargement, the stripline and the microstrip transmission line configurations.
Figure 3B:
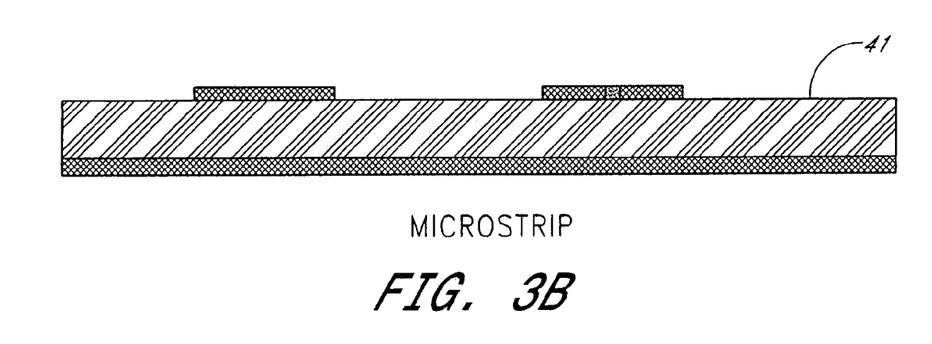

The preferred embodiments of this invention utilize a novel combination of transmission line configuration(s) of stripline 40 or microstrip 41 (FIG. 3), to solve the problem of converting Quadrax to Twinax. Moreover, the embodiment described advantageously enables the conversion to be performed in a connector apparatus. As shown in FIG. 2, two Twinax conductors 25a and 25b are connected to one end 39 of a connector apparatus 50 and the Quadrax cable 30 is connected to the other end 51 of a mating connector apparatus 52. Either stripline or microstrip configurations may be used, however, stripline will be described below.

Strip transmission line is a method of transmitting RF signals in a controlled impedance environment. The signal bearing line is a metal strip 42a, 42b between two ground planes 43a, 43d and separated by dielectric circuit boards 44a, 44b (see FIG. 3). The conductive metal strips 42a, 42b are typically formed on the dielectric boards 44 by selective removal by chemical etching of the metal to leave the residual strips 42.

The initial construction of one embodiment of the invention is best illustrated in FIGS. 4, 5, 6 and 8 in which a multi-level stack comprises locating a first trace layer on level 2 between groundplanes 1 and 3 and a second trace layer on level 4 between ground planes 3 and 5. The first traces 60, 61 on trace level 2 terminate at pad openings 65, 66 whereas a second set of traces 70, 71 on trace level 4 terminate at pad openings 75, 76. The two conductors of a first Twinax line 25a connect to respective ends of 80, 81 of traces 60, 61. The twin conductors of a second Twinax line 25b connect to respective ends 85, 86 of traces 70, 71. The differential pair of conductors are soldered, or otherwise affixed to the surface pads on levels 2 and 4 shown in FIGS. 5 and 6.

Figure 4:
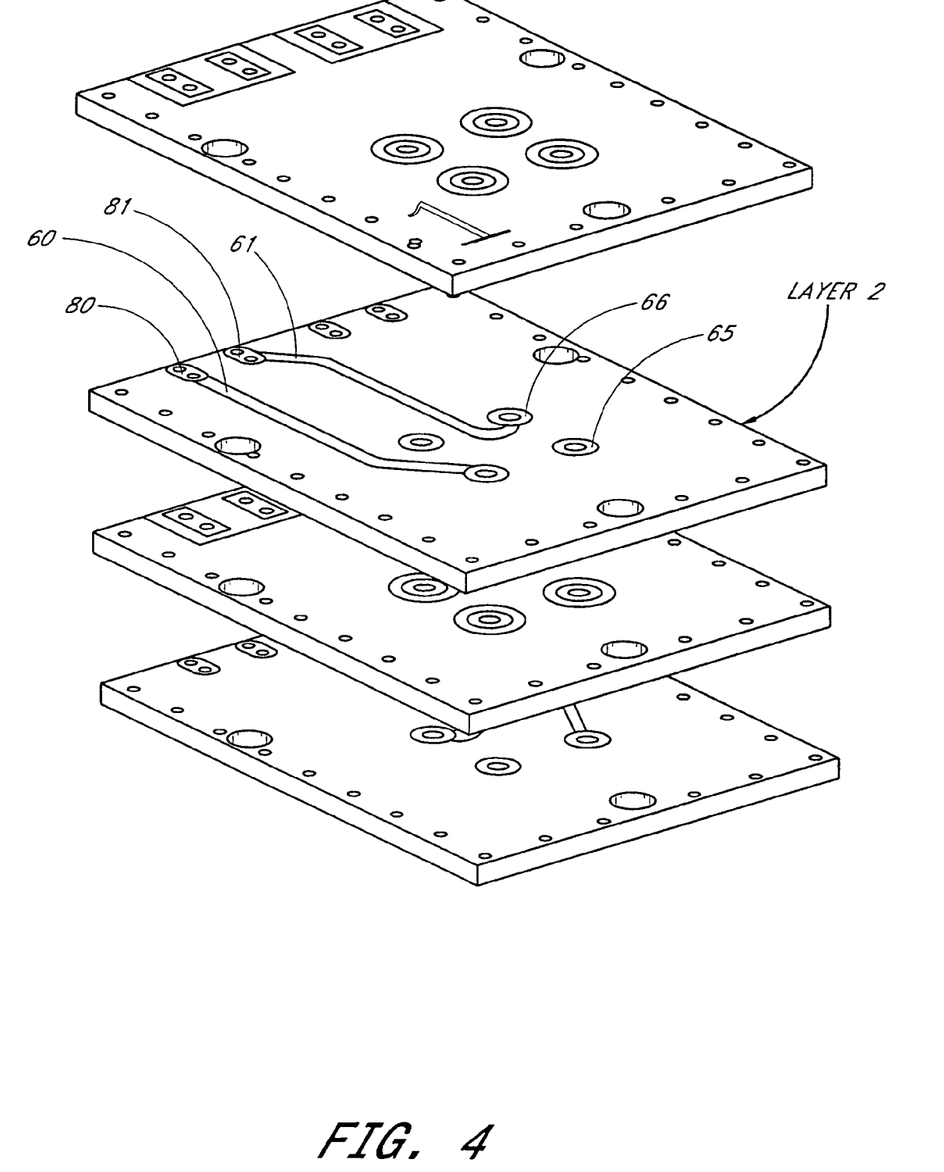
FIG. 4 is an enlarged perspective view of a four layer stripline used in the preferred embodiment of this invention.
Figure 5:
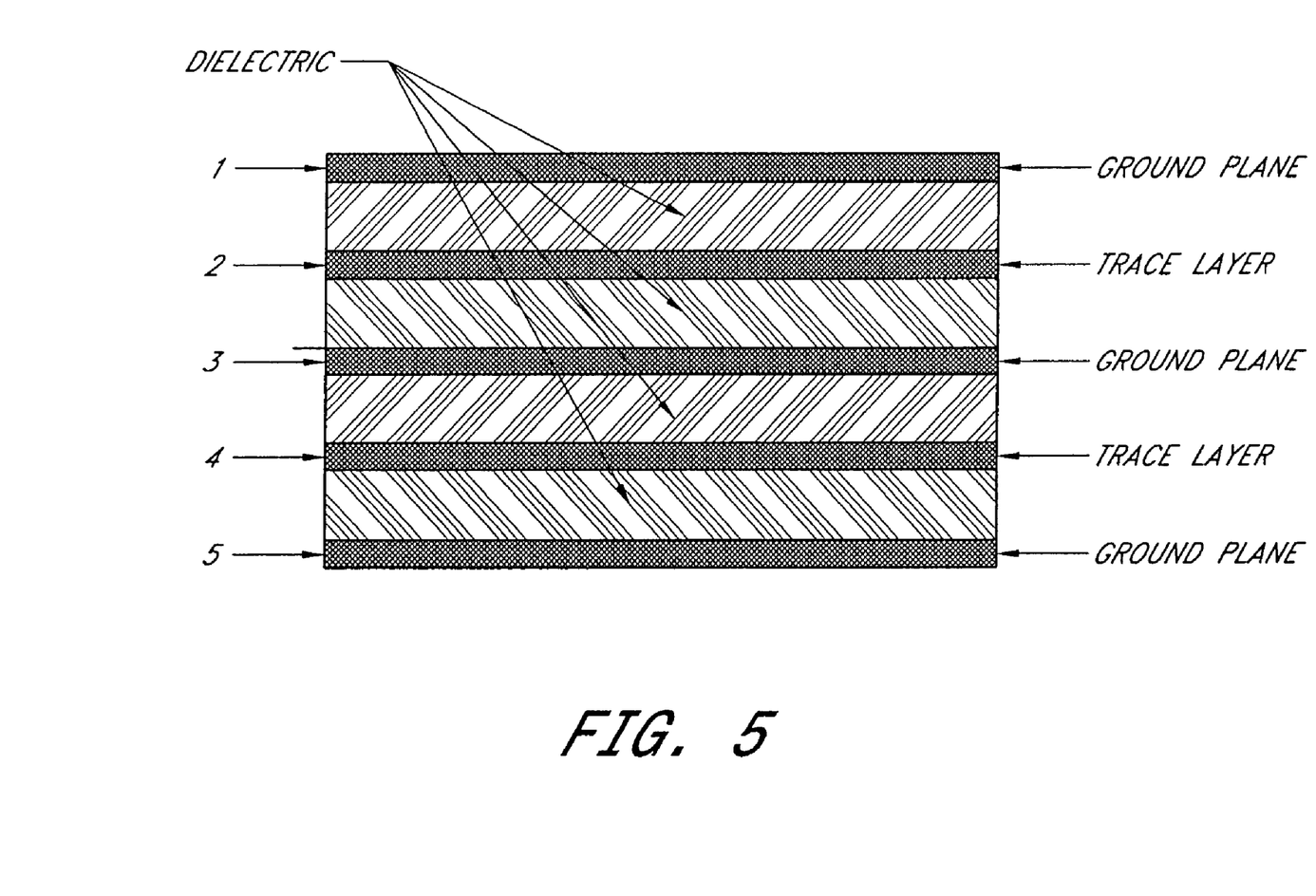
FIG. 5 is a horizontal elevational view of the stripline of FIG. 4.
Figure 8:
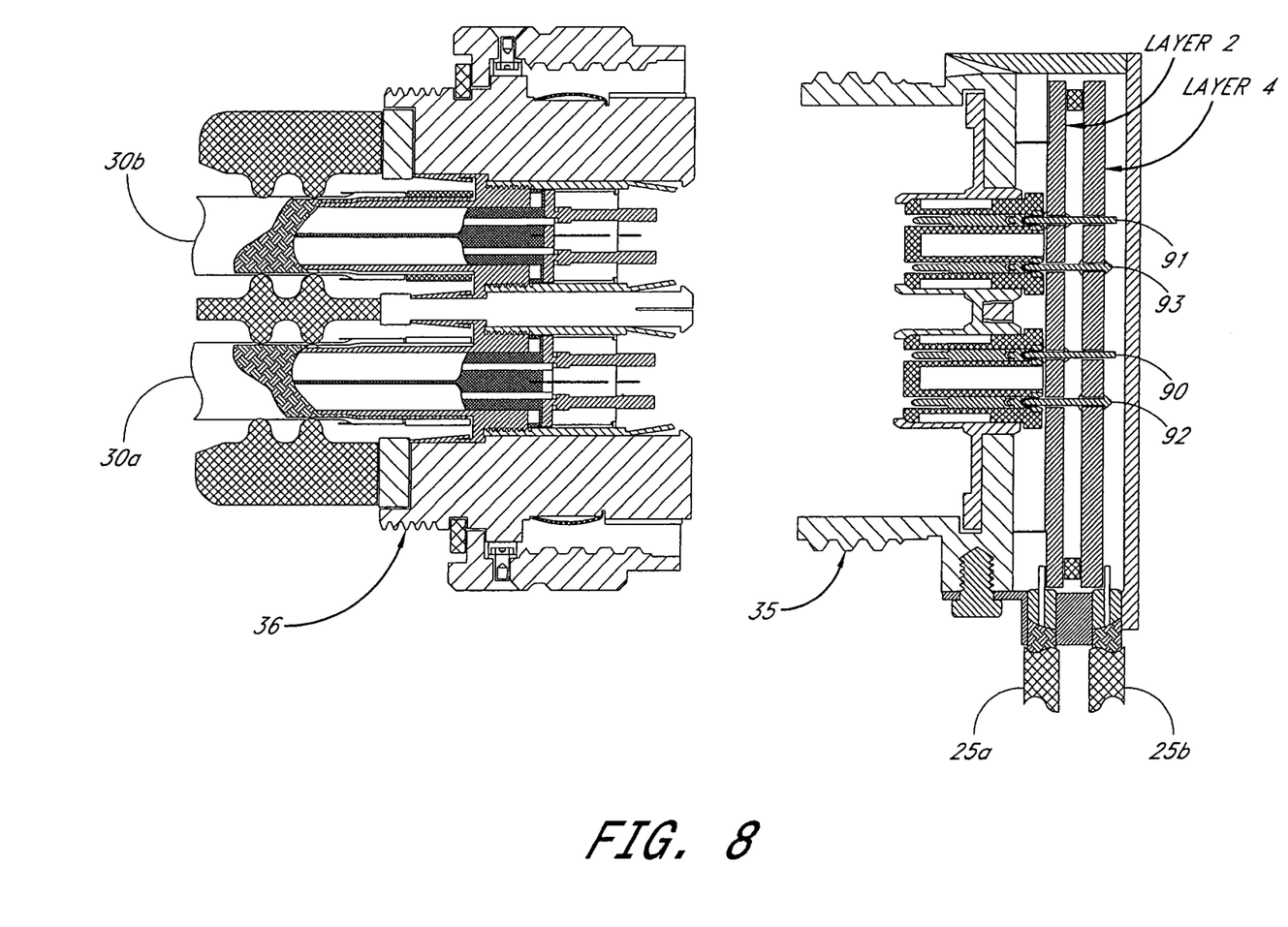
FIG. 8 illustrates a connector utilizing the multiple layers of FIG. 7.

The four conductors of the Quadrax cable 30 respectively electrically connect to one of the strips 60, 61, 70, 71 by contact pins 90, 91, 92, 93. These contact pins are best shown in FIG. 8, which illustrates in cross section a connector adapted to connect to a pair of side-by-side Quadrax cables 30a and 30b and in FIG. 12, which illustrates a connector adapted to connect to a single Quadrax cable. Contact pins 90, 91, 92, 93 couple straight onto the stripline traces without crossing over or disturbing the relative positions of the selected diagonal pairs. This is accomplished by a series of plated through holes through the multi-level stack and is best shown in FIGS. 4 and 5. The diagonal pairs from the Quadrax interface are attached to the pad openings on their assigned traces, while merely passing through the through-holes in the other board having the traces and pads belonging to the other diagonal pair. Thus, referring to FIGS. 8 and 12, one pair of pins 90, 91 are in electrical contact with through-hole pad openings, such as pads 65, 66 of layer 2 (shown in FIG. 6), but do not contact the traces on layer 4. As noted above, these through-hole openings 65, 66 are respectively in contact with traces 60, 61. The other pair of pins 92, 93 (best shown in FIG. 8) are in electrical contact with through-hole pad openings of layer 4 (examples being pads 75, 76 shown in FIG. 6), but merely pass through layer 2 without contacting the traces on this layer 2. This maintains the impedance relatively consistent and therefore not frequency sensitive. layer 2. This maintains the impedance relatively consistent and therefore not frequency sensitive.

Referring to FIGS. 2 and 8, when connector body 36 engages connector body 35, the pins 90, 91, 92, 93 of connector 35 are engaged by corresponding conductors in connector 36 which in turn are connected to the internal conductors of one or more Quadrax cables 30.

Figure 6:
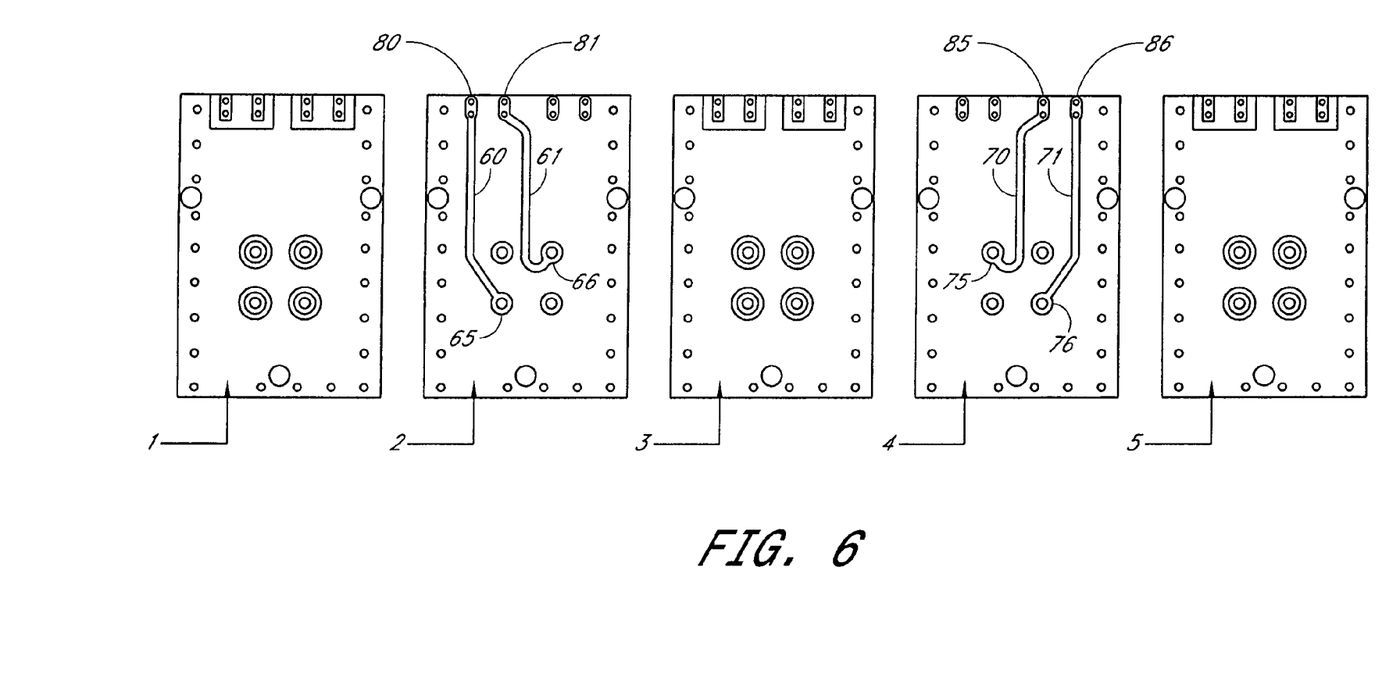
FIG. 6 illustrates a top plan view of the ground plane plans and trace layers of the stripline of FIG. 4.

Referring to FIGS. 4, 5 and 6, a common ground plane (3) is located between the two trace layers (2 and 4). As a result, the trace signal pairs 60, 61 and 70, 71 will be isolated with each signal pair in the controlled impedance of effectively two separate transmission systems. As described above and shown in FIGS. 6 and 8, these separated pairs run to respective surface pads 80, 81 and 85, 86 and selected through plated-through holes connect to the assigned embedded traces.

Figure 7:
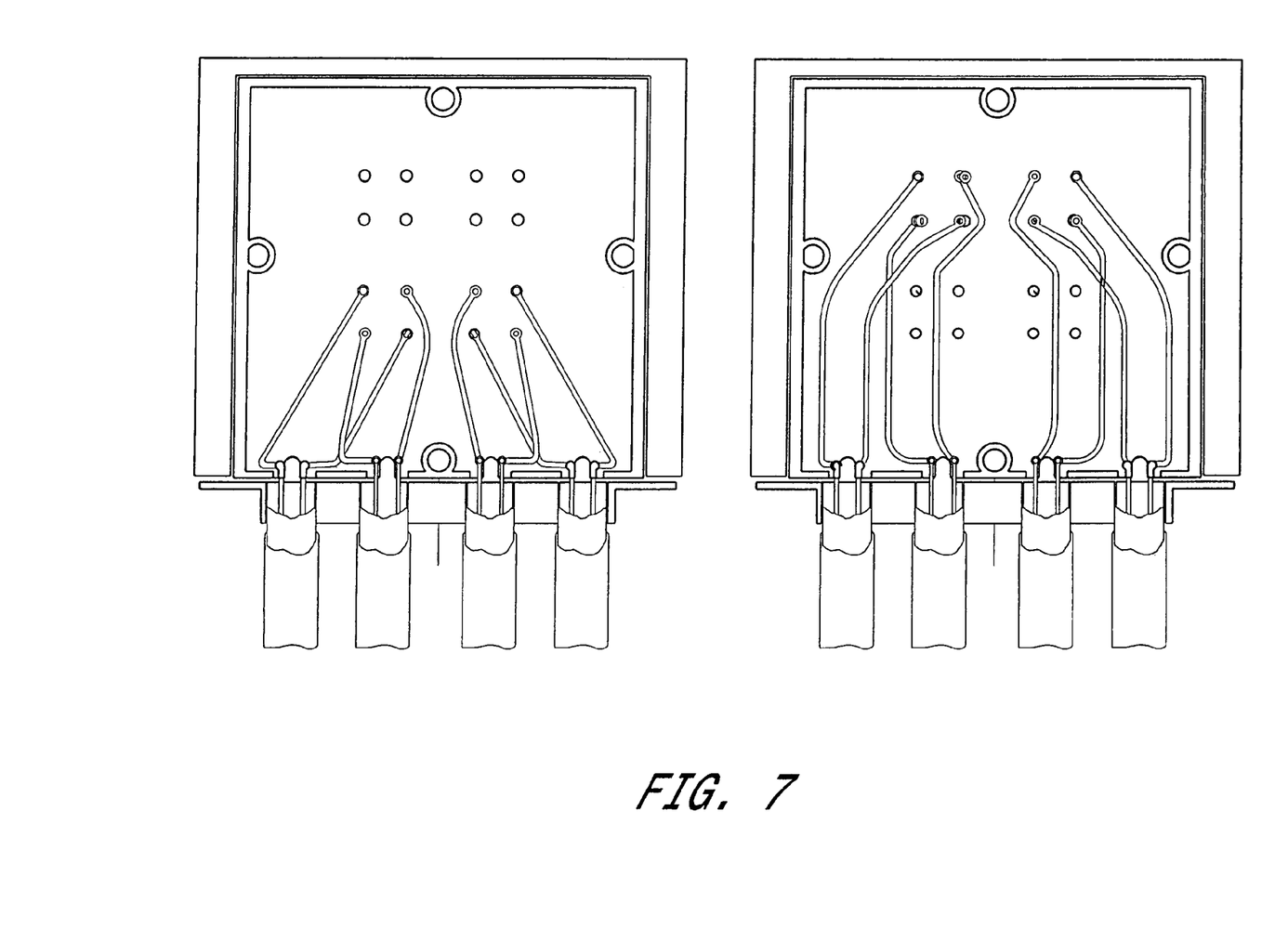
FIG. 7 illustrates the use of multiple layers of stripline board.

The configuration described and shown in FIGS. 4, 5, and 6 can be duplicated on a multiplicity of regions on a single multi-layered stripline board or several boards (as shown in FIG. 7).

Figure 9:
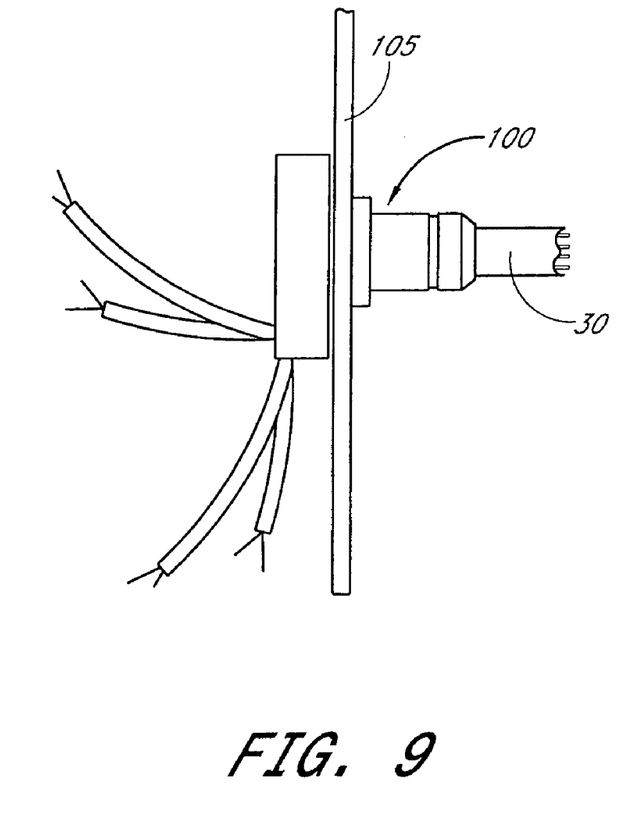
FIG. 9 is an elevational end view of another embodiment of the invention in which the Quadrax cable entry is bolted to a panel.

The embodiment shown in FIGS. 2 and 8 includes a connector having sections 35, 36. However, an embodiment of the invention can be also configured to attach directly to a panel with a header as shown in FIG. 9, wherein the Quadrax cable entry 100 is simply bolted to a panel 105.

Figure 10:
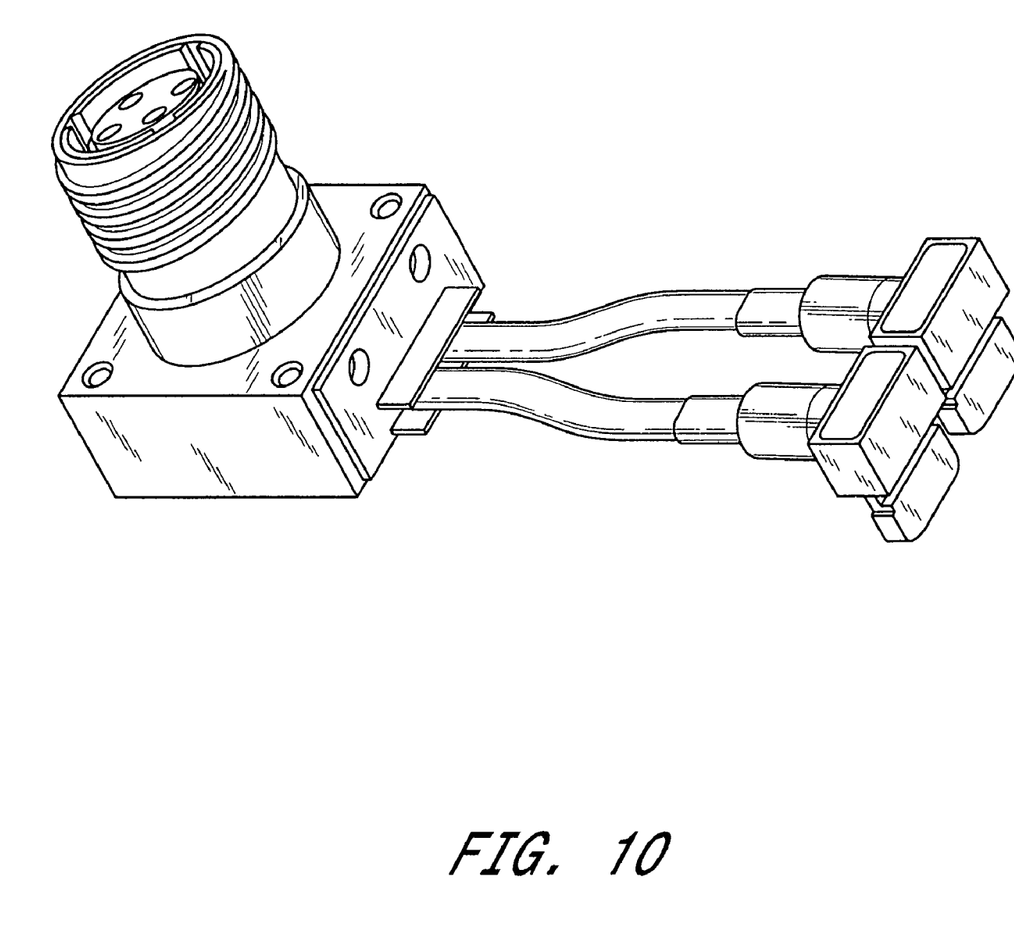
FIG. 10 is a perspective view of the Quadrax to Twinax connector including a connector for the Quadrax cable.
Figure 11:
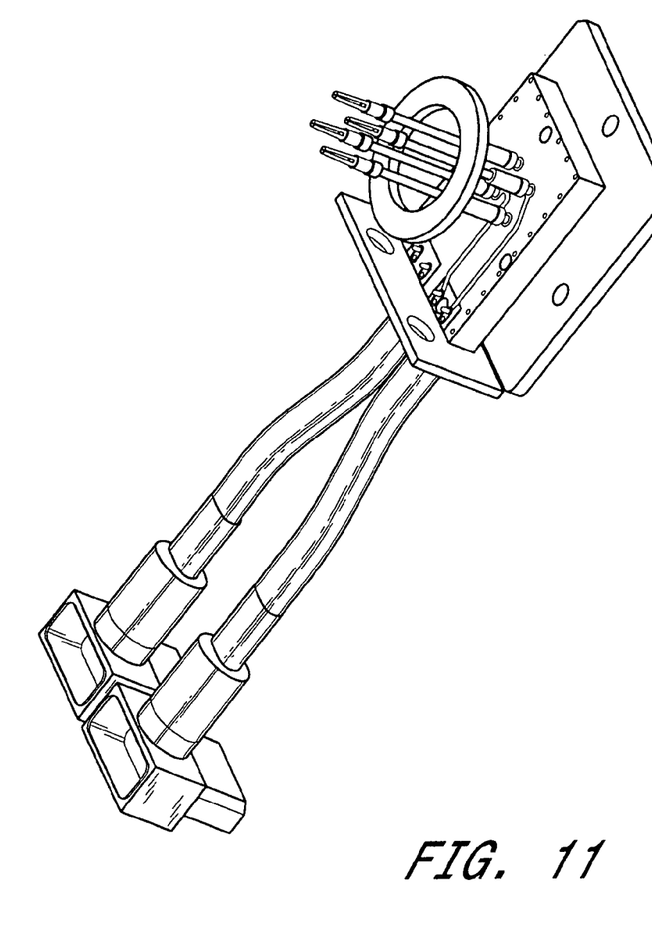
FIG. 11 is another perspective view of the apparatus of FIG. 10 with the connector body removed to illustrate the internal connector pins.

The 90° exit of the separate differential Twinax cables 25a and 25b shown in FIGS. 8, 10 and 11 are examples of the invention. In other embodiments, the cables 25a and 25b can exit at any convenient angle including straight out the back, as shown in FIG. 9.

Figure 12:
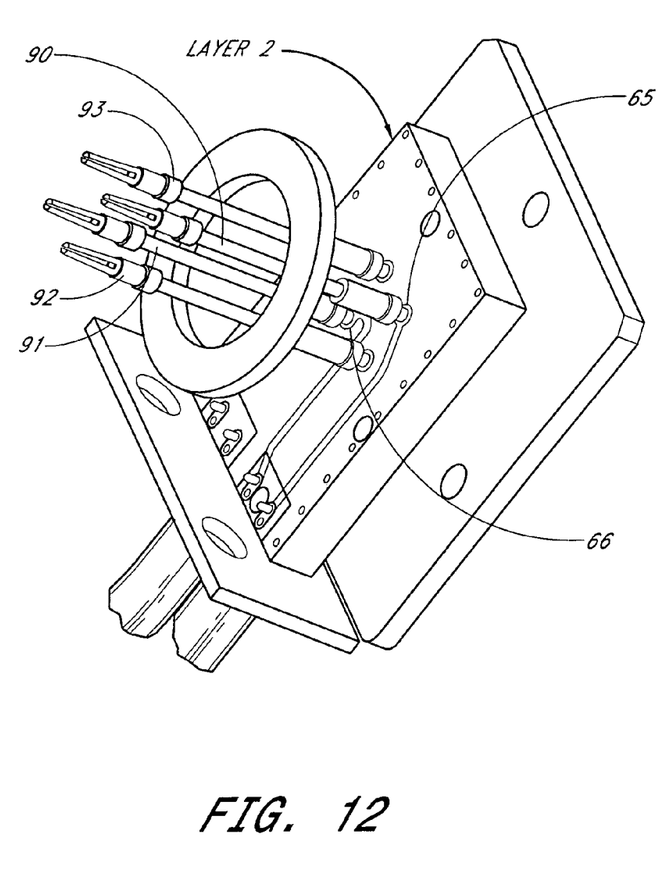
FIG. 12 is an enlarged view of the connector of FIGS. 10 and 11 with the layer 2 of FIGS. 5 and 6 exposed.

FIGS. 11 and 12 show the assembly of the connector of FIG. 10 with the connector shell removed exposing the stripline assembly.

The dimensions and material properties of the boards shown in FIGS. 5 and 6 are determined by the applicable well known equations. When the preferred conditions are achieved, the transmitted signal (source) is very efficiently delivered to its destination (load).

The equations for stripline are included in Appendix A(1) and A(2). The specifications for exemplary dielectric board 44 are provided by Appendix B. Manufacturing information of an exemplary embodiment are shown in Drawing No. 145-0097-000 (Appendices C1, C2 and C3).

Although this invention has been described in terms of certain preferred embodiments, other embodiments that are apparent to those of ordinary skill in the art, including embodiments which do not provide all of the benefits and features set forth herein, are also within the scope of this invention.

What is claimed is:

1. A conversion apparatus for connecting from a high speed data cable having two diagonal pairs of conductors comprising:
   physically displaced first and second circuits;
   a ground plane between said circuits; and
   conductors from said first and second circuits connected respectively to said orthogonal pairs of conductors without disturbing the relative positions of said diagonal pairs of conductors.

2. A connector for efficiently connecting Quadrax and Twinax cables comprising:
   a multi-level stack of boards including first and second trace layers and a ground plane between said first and second trace layers;
   said trace layers including four substantially diagonal through holes with said first trace layers connected to one set of diagonal holes and said second trace layers connected to the other set of diagonal holes;
   said first trace layer adapted to connect to a first Twinax cable;
   said second trace layer adapted to connect to a second Twinax cable;
   said one set of diagonal through holes adapted to connect to one set of diagonal wires of said Quadrax cable; and
   said other set of diagonal through holes adapted to connect to the remaining set of diagonal wires of said Quadrax cable.

3. The connector of claim 2, wherein said trace layers are transmission lines.

4. The connector of claim 3, wherein said trace layers are strip line configurations.

5. The connector of claim 3, wherein said trace layers are microstrip configurations.

6. The connector of claim 3, having at least two sets of four substantially diagonal through holes to accommodate at least two Quadrax cables.

7. The connector of claim 3, comprising respective pairs of diagonal electrical connector pins passing through said through-holes, said pins electrically connecting respective trace layers for connecting the orthogonal pairs of conductors of said Quadrax to respective trace layers without disturbing the relative positions of said orthogonal conductors.

8. The connector of claim 3, wherein said sets of diagonal through holes are in substantial alignment with the diagonal wires of said Quadrax cable.

9. A connector for efficiently connecting Quadrax and Twinax cables comprising:
- a multi-level stack of boards including first and second trace layers and a ground plane between said first and second trace layers;
- said trace layers are transmission lines and include four substantially diagonal through holes with said first trace layer connected to one set of diagonal holes and said second trace layer connected to the other set of diagonal holes;
- said first trace layer adapted to connect to a first Twinax cable;
- said second trace layer adapted to connect to a second Twinax cable;
- said one set of diagonal through holes adapted to connect to one set of diagonal wires of said Quadrax cable;
- said other set of diagonal through holes adapted to connect to said remaining set of diagonal wires of said Quadrax cable; and
- respective pairs of diagonal electrical connector pins passing through said through holes, said pins electrically connecting to respective trace layers for connecting the orthogonal pairs of conductors of said Quadrax to respective trace layers without disturbing the relative positions of said orthogonal conductors.

* * * * *